United States Patent
Venkatesan

(10) Patent No.: US 10,606,051 B2
(45) Date of Patent: Mar. 31, 2020

(54) OPTICAL SYSTEM FOR LIGHT COLLECTION

(71) Applicant: Varun Akur Venkatesan, Bangalore (IN)

(72) Inventor: Varun Akur Venkatesan, Bangalore (IN)

( * ) Notice: Subject to any disclaimer, the term of this patent is extended or adjusted under 35 U.S.C. 154(b) by 0 days.

(21) Appl. No.: 14/914,879

(22) PCT Filed: Sep. 1, 2014

(86) PCT No.: PCT/IB2014/064174
§ 371 (c)(1),
(2) Date: Feb. 26, 2016

(87) PCT Pub. No.: WO2015/028991
PCT Pub. Date: Mar. 5, 2015

(65) Prior Publication Data
US 2016/0209633 A1    Jul. 21, 2016

(30) Foreign Application Priority Data

Sep. 1, 2013 (IN) ............................. 3352/CHE/2013
Sep. 1, 2013 (IN) ............................. 3355/CHE/2013

(51) Int. Cl.
*G02B 17/00* (2006.01)
*G02B 27/14* (2006.01)
(Continued)

(52) U.S. Cl.
CPC ......... *G02B 17/086* (2013.01); *G02B 6/0016* (2013.01); *G02B 6/0018* (2013.01);
(Continued)

(58) Field of Classification Search
CPC ....... G02F 1/133526; G02C 3/00; G02C 7/02; G02C 5/00; G02C 3/04; G02C 5/006;
(Continued)

(56) References Cited

U.S. PATENT DOCUMENTS 4,863,224 A    9/1989  Afian et al.
6,002,829 A *  12/1999 Winston .................... F21V 5/02
                                                      385/129

(Continued)

FOREIGN PATENT DOCUMENTS

EP    1355174    10/2003
EP    1562065    8/2005
(Continued)

OTHER PUBLICATIONS

International Search Report and Written Opinion issued in the corresponding International PCT application No. PCT/IB2014/064174, dated Jan. 20, 2015, 8 pages.

*Primary Examiner* — Dawayne Pinkney
(74) *Attorney, Agent, or Firm* — Hamre, Schumann, Mueller & Larson, P.C.

(57) ABSTRACT

The present invention relates to an optical system, wherein the optical system comprises a transparent optic defining an optical volume, the transparent optic comprising a first main face adapted to admit light into the optical volume and a first turning optic for turning the light admitted inside the optical volume such that the light is internally reflected within the optical volume.

19 Claims, 13 Drawing Sheets

(51) Int. Cl.
*G02F 1/1335* (2006.01)
*G02C 5/00* (2006.01)
*A61B 3/00* (2006.01)
*G02B 17/08* (2006.01)
*G02B 19/00* (2006.01)
*H01L 31/054* (2014.01)
*F21V 8/00* (2006.01)

(52) U.S. Cl.
CPC ....... G02B 6/0026 (2013.01); G02B 19/0028 (2013.01); G02B 19/0038 (2013.01); H01L 31/0543 (2014.12); H01L 31/0547 (2014.12); *G02B 6/0031* (2013.01); *G02B 6/0076* (2013.01); *Y02E 10/52* (2013.01)

(58) Field of Classification Search
CPC .......... A61B 3/103; A61B 3/14; A61B 3/113; A61B 3/1225; B82Y 20/00; H04N 9/3197; G03H 1/22; G03H 1/08; G02B 13/10; G02B 17/086; G02B 17/0808; G02B 27/0172; G02B 5/1842; G02B 5/32; G02B 27/145; G02B 27/144; G02B 3/00; G02B 6/124; G02B 27/2214
USPC ... 359/726, 730, 633, 567, 15, 19, 32–34, 9, 359/618, 629–630, 642, 678; 349/5–8, 349/11, 15; 385/37, 129; 351/200, 351/205–206, 210, 221, 209, 41, 56, 351/63–64, 159.01, 159.75
See application file for complete search history.

(56) References Cited

U.S. PATENT DOCUMENTS

| | | | | |
|---|---|---|---|---|
| 7,873,257 | B2* | 1/2011 | Morgan | F21S 11/00 385/146 |
| 2006/0262562 | A1 | 11/2006 | Fukasawa et al. | |
| 2009/0199893 | A1 | 8/2009 | Bita et al. | |
| 2009/0199900 | A1* | 8/2009 | Bita | H01L 31/0543 136/259 |
| 2010/0111472 | A1* | 5/2010 | DeJong | G02B 27/0081 385/31 |

FOREIGN PATENT DOCUMENTS

| | | |
|---|---|---|
| EP | 2061092 | 5/2009 |
| JP | 2006065360 | 3/2006 |
| JP | 2007218540 | 8/2007 |
| WO | 2010033632 | 3/2010 |

* cited by examiner

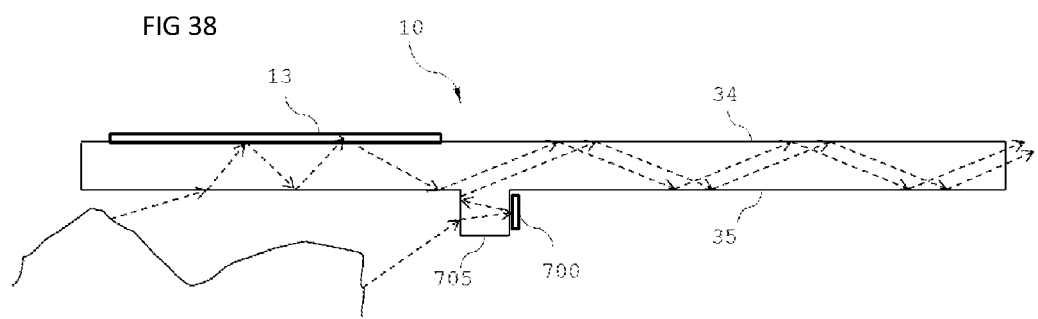

OPTICAL SYSTEM FOR LIGHT COLLECTION

The invention relates to light capture and collection, and more specifically to an optical system for light collection Conventionally, light is acquired using a collection optic such as a lens. In the case of a camera, an image sensor is placed behind the lens to capture an image of the target. Lenses are used in various configurations such as solar concentration, light field collection, etc. While lenses are useful and ubiquitous, they pose a fundamental disadvantage. As the field of view becomes larger, the distance between the lens and the target increases, making the light collection device bulky. Bulky configurations are undesirable since they are difficult to work with, cost more and are less portable. Transportation and installation of bulky devices cause additional problems and cost.

The object of the invention is to provide an optical system with large field of view with reduction in the distance from the target.

The object of the invention is achieved by an optical system, wherein the optical system comprises a transparent optic defining an optical volume, the transparent optic comprising a first main face adapted to admit light into the optical volume and a first turning optic for turning the light admitted inside the optical volume such that the light is internally reflected within the optical volume.

According to an embodiment, the light is internally reflected successively within the optical volume.

According to another embodiment, the transparent optic further comprises a second main face being opposite to the first main face, the first turning optic being arranged on a portion of one of the first main face and the second main face.

According to yet another embodiment, the transparent optic further comprises one or more side faces configured to direct light outside the optical volume.

According to yet another embodiment, the first turning optic is configured to turn the light to a direction different from the geometric normal of the first main face.

According to yet another embodiment, the first turning optic is configured to turn the light to a direction different from the geometric normal of the second main face.

According to yet another embodiment, the first turning optic comprises an array of geometrical structures for turning the light.

According to yet another embodiment, the geometrical structures are adapted to selectively alter the direction of reflection.

According to yet another embodiment, the geometrical structures are adapted to selectively alter the direction of reflection via a motion of one or more geometrical faces of the geometrical structures.

According to yet another embodiment, one or more faces of the geometrical structures are programmed to vibrate at a desired frequency.

According to yet another embodiment, one or more faces of the geometrical structures are altered by micro-fluidic actuation.

According to yet another embodiment, the array of geometrical structures are prisms.

According to yet another embodiment, the first turning optic is configured to simultaneously direct portions of the incident light in more than one directions.

According to yet another embodiment, the first turning optic is made of a material of laterally varying refractive index.

According to yet another embodiment, the first turning optic is made of one or more layers of axially varying refractive index.

According to yet another embodiment, the first turning optic is curved in one or more directions.

According to yet another embodiment, the first turning optic is arranged on a portion of one of the first main face and the second main face.

According to yet another embodiment, the first turning optic is a made of an elastic material.

According to yet another embodiment, the first turning optic is made of a flexible material.

According to yet another embodiment, the first turning optic is a film.

According to yet another embodiment, the first turning optic is a layer formed on a portion of one of the first main face and the second main face.

According to yet another embodiment, the second main face is parallel to the first main face.

According to yet another embodiment, the second main face is at an angle to the first main face.

According to yet another embodiment, the optical volume is formed of a solid.

According to yet another embodiment, the optical volume is formed of a fluid.

According to yet another embodiment, at least a portion of the optical volume is formed of vacuum.

According to yet another embodiment, the transparent optic is flexible.

According to yet another embodiment, the transparent optic is stretchable.

According to yet another embodiment, at least one of the first main face, the second main face and the first turning optic is coated with an antireflection coating.

According to yet another embodiment, wherein the optical system further comprises a secondary turning optic for directing the light at a desired angle onto the first main face, the secondary turning optic coupled to the first main face via a layer having a refractive index lower than the optical volume.

According to yet another embodiment, wherein the optical system further comprises an additional transparent optic defining an additional optical volume and a coupler adapted to receive the light emerging from the optical volume of the transparent optic after internal reflection and direct the light onto the additional transparent optic, wherein the additional transparent optic is adapted to admit the light directed by the coupler.

According to yet another embodiment, a wavelength selective filter is placed between the first turning optic and the optical volume.

According to yet another embodiment, wherein the optical system further comprises a coupling device to direct light onto a portion of the first main face.

According to yet another embodiment, a first portion of the incident light is admitted inside the optical volume and a second portion of the incident light is transmitted.

According to yet another embodiment, the first turning optic is removably attached onto one of the first face and the second face.

According to yet another embodiment, the geometrical structures are adapted to reflect a first portion of the incident light and transmit a second portion of the incident light.

According to yet another embodiment, the transparent optic comprises a propagation area comprising a triangular geometrical profile, wherein the light propagates through internal reflections between the first main face and the second main face in the propagation area.

According to yet another embodiment, wherein the optical system comprises a plurality of transparent optics are arranged one above another, wherein at least one said transparent optic is configured to direct a portion of the light admitted from the scene to at least one said another transparent optic.

According to yet another embodiment, the transparent optic is configured to admit light from a plurality of different viewpoints and direct the light at different positions of the first turning optic for light corresponding to different viewpoints.

According to yet another embodiment, the transparent optic comprises a cylindrical geometrical structure.

The present invention is further described hereinafter with reference to illustrated embodiments shown in the accompanying drawings, in which:

FIG. 38 illustrates an optical system according to an embodiment herein;

The invention is based on the concept of using a turning optic for providing an added turn to light rays admitted inside the optical volume of a transparent optic. The light rays undergo successive internal reflections within the optical volume before exiting.

Figure 1:
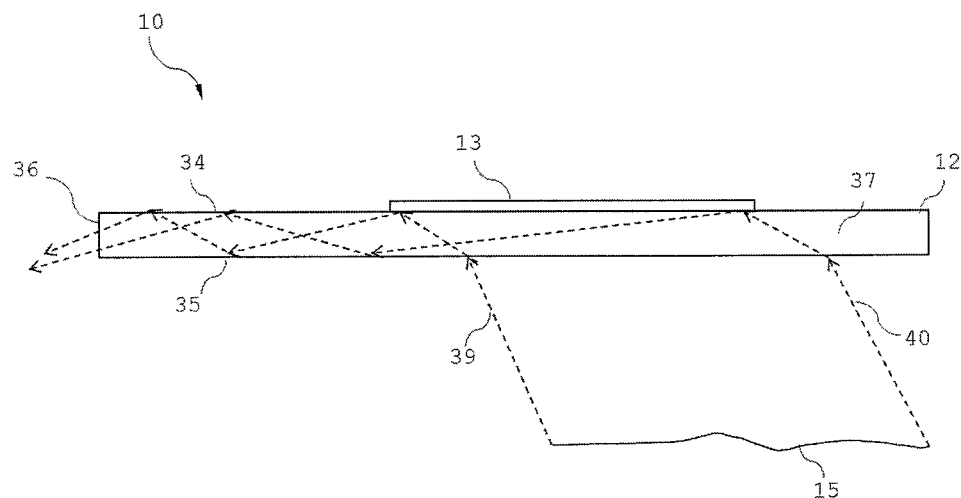
FIG. 1 illustrates an exemplary optical system according to an embodiment herein.

FIG. 1 illustrates an optical system 10 according to one embodiment of the present invention. The optical system 10 comprises a transparent optic 12 defining an optical volume 37 and a first turning optic 13. The optical system 10 captures light from a scene 15 or sources in front of it. Light from the scene 15 enters the optical volume 37. Upon entering the optical volume 37, light reaches the first turning optic 13 and gets turned in a manner to be contained within the optical volume 37. Upon traveling a certain distance inside the optical volume 37, the light reaches a side face 36 and exits the optical volume 37. The term optical volume herein refers to the volume wherein the light undergoes to and forth reflection before exiting the transparent optic 12. The side face 36 may be at an angle to the first main face 35 or the second main face 34. The side face 36 may be perpendicular to either the first main face 35 or the second main face 34. Depicted in FIG. 1 are two light rays emerging from different portion of the scene 15 wherein on entering the optical volume, reach the side face 36 at different angles of incidence.

Figure 2:
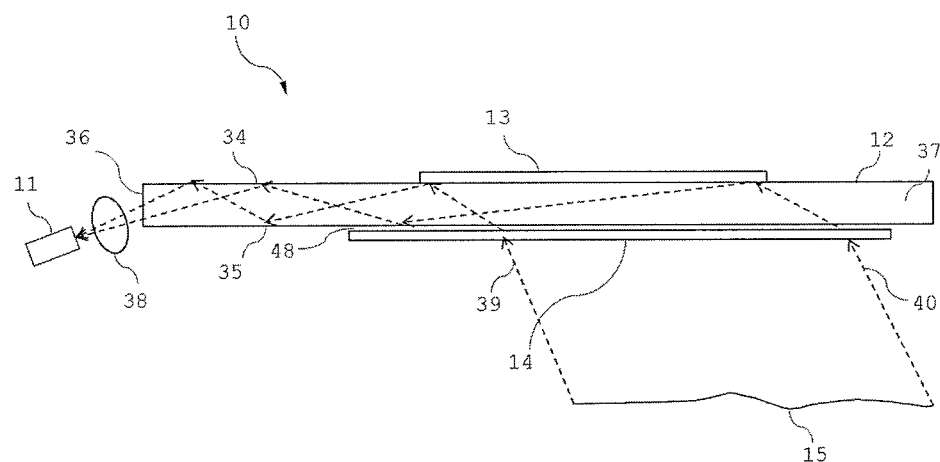
FIG. 2 illustrates an exemplary optical system in combination with a photosensor assembly 11 according to an embodiment herein.

FIG. 2 discloses an optical system 10 in combination with a photosensor assembly 11 according to an embodiment herein. In the shown example of FIG. 2, the light from a light source or scene 15 reaches the secondary turning optic 14. The secondary turning optic 14 directs the light at a prescribed angle onto the first main face 35. For example, the prescribed angle is glancing. In the show example of FIG. 2, the secondary turning optic 14 is coupled to the first main face 35 via a layer 48 having a refractive index lower than the refractive index of the optical volume 37. The first main face 35 is adapted to admit the light. The light admitted by the first main face 35 enters the optical volume 37. The admitted light inside the optical volume reaches the first turning optic 13. The first turning optic 13 is arranged on at least a portion of the second main face 34. The first turning optic 13 turns the light such that the light travels in a confined manner between the second main face 34 and the first main face 35 to reach the side face 36. The light exits the optical volume 37 through the side face 36 and is altered by a tertiary optic 38 such as a lens or a grating to reach the photosensor assembly 11. The photosensor assembly 11 is capable of detecting the light collected from different parts of the scene 15. This is due to a piece-wise spatial relationship preserving aspect of the optical system 10. The spatial relationships of light from within atleast a subset of the scene are preserved when the light reaches the photosensor assembly 11. While the spatial relationships of the whole scene may be preserved in some embodiments, it is sufficient in other embodiments that they are preserved within a subset of the scene while not necessarily the whole scene. The optical system 10 is also capable of preserving angular relationships in a piece wise manner.

This provides the advantage of the optical system 10 collecting light from a large area scene 15 or source and condensing it to a smaller photosensor assembly 11. Also provides reduction in the distance between the scene 15 and the optical system 10. Conventional system, such as a lens does not provide the advantage of reduction in the distance. Also, the lens has the disadvantage of being bulky. The optical system 10 described in the embodiments herein provides a compact and substantially flat configuration.

Referring still to FIG. 2, the propagation of light from the scene to the photosensor assembly 11 is illustrated by the rays 39 and 40. The rays 39 and 40 upon reaching the first turning optic 13 undergo a change in the angle when they are reflected back into the optical volume 37. The rays 39 and 40 continue and reach the opposite face, i.e. the first main face 35, wherein the rays 39 and 40 reflected back again while simultaneously moving further from their original point of entry into the optical volume 37. This process repeats until the rays 39 and 40 reach beyond the first turning optic 13. The ray 39 proximate to the side face 36 undergoes a smaller number of reflections in the optical volume 37 than the distal ray 40. Hence the ray 40 experiences a higher change in angle than the ray 39. In his manner, the spatial relationships are converted into angular relationships and preserved. Upon reaching beyond the first turning optic 13, the rays 39 and 40 do not further undergo change in angle and are repeatedly totally internally reflected towards the side face 36, via which they exit the optical volume 37. Thus, the rays 39 and 40 undergo successive reflections within the optical volume 37, wherein the reflections caused by the first turning optic 13 causes change in angle and the reflections beyond the portion of the first turning optic 13 does not cause change in angle. The tertiary optic 38 transfers the angular spread of the rays 39 and 40 onto the photosensor assembly 11 such that different pixels of the photosensor assembly 11 are illuminated from the rays 39 and 40 of different angles. Hence, the spatial relationship or light rays 39 and 40 from the source or scene 15 are preserved at the photosensor assembly 11.

Figure 3:
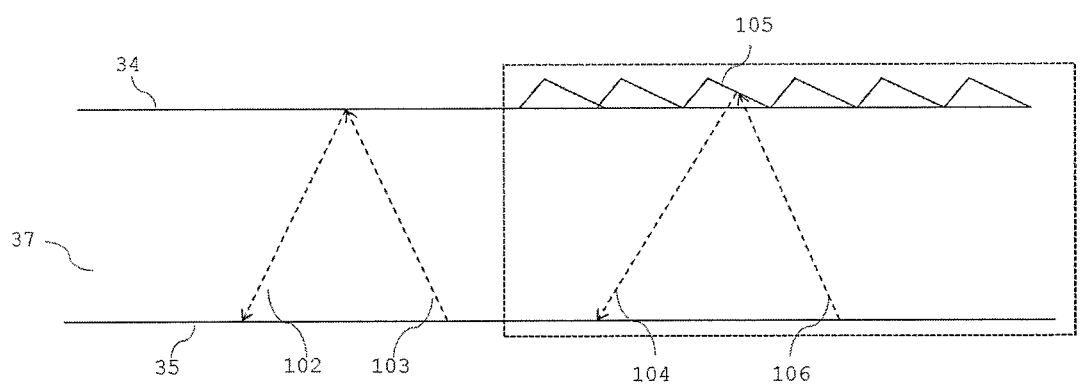
FIG. 3 illustrates a transparent optic and a first turning optic in more detail according to an embodiment herein.

FIG. 3 illustrates a transparent optic 12 and a first turning optic in more detail according to an embodiment herein. According to an embodiment, the first turning optic 13 comprises an array of geometrical structures 105 for turning the light. In the shown example of FIG. 3, an array of prisms is illustrated as the geometrical structure 105. The light rays 106 entering the first main face 35 and reaching the first turning optic 13 continue into the geometrical structures 105 and are reflected as the light rays 104 with an added turn angle. However, upon exiting the first turning optic 13, the reflection of light is determined by the geometry of the second main face 34 and the first main face 35 and may not experience the added turning angle imparted by the first turning optic 13, as illustrated by the light rays 103 and 102. According to one embodiment, the first turning optic 13 may be clamped or glued to an existing transparent optic 12 such as a glass window. According to another embodiment herein, the first turning optic 13 may be embossed, inscribed or machined into the transparent optic 12. The transparent optic 12 can be implemented using an off the shelf glass, acrylic or any other transparent slab wherein the first main face and the second main face 34 may be parallel to each other. This reduces the cost of the optical system and eases transportation and installation. However, the transparent optic can also be implemented using devices wherein the first main face and the second main face are not parallel, i.e., are at an angle.

Figure 4:
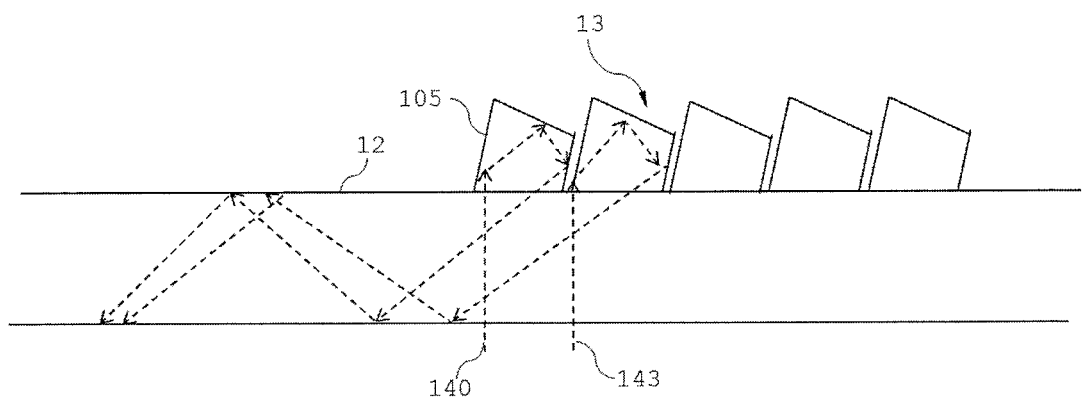
FIG. 4 illustrates an array of geometrical structures of a first turning optic according to another embodiment herein.

FIG. 4 illustrates an array of geometrical structures of a first turning optic according to another embodiment herein. In the shown example of FIG. 4, an array of trapezoidal structures is illustrated as the geometrical structures 105. The light rays 140 and 143 are reflected by the trapezoidal structures with the added turning angle. According to another embodiment, the first turning optic 13 can also comprise varying refractive index materials, laterally varying geometries, laterally varying graded refractive index materials. According to yet another embodiment, the first turning optic can also comprise of layers of thin films of varying refractive indices, each of which could further comprise of laterally varying refractive index.

Figure 5:
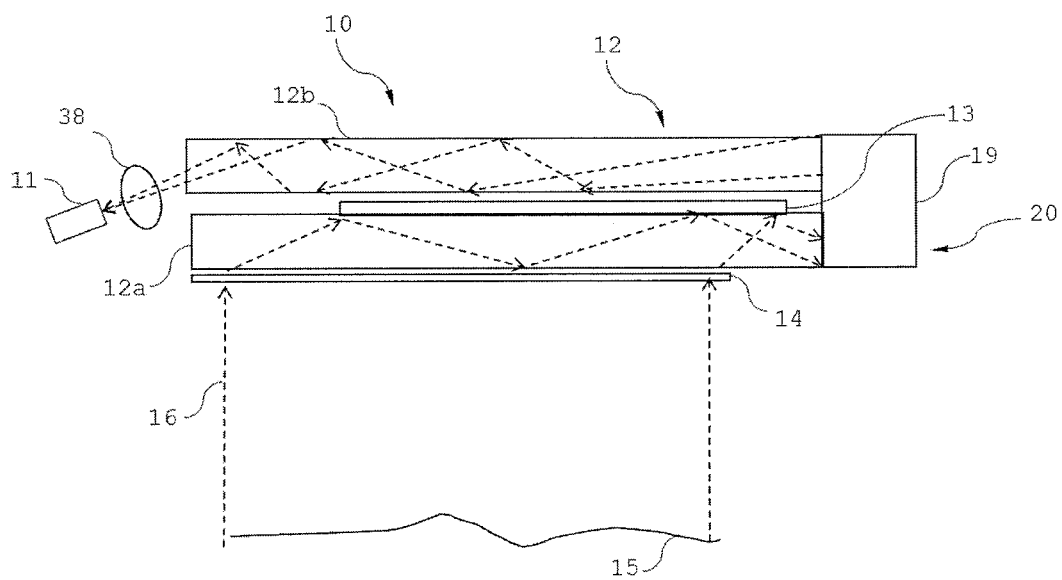
FIG. 5 illustrates an optical system according to an embodiment herein.

Referring now to FIG. 5, according to one embodiment, a further compact form of the optical system 10 is achieved using an additional transparent optic 20 and a coupler 19. The additional transparent optic 20 defines an additional optical volume 37b. The optical volume 37a and the additional optical volume 37b defined by the transparent optic 12 and the additional transparent optic 20 together define the optical volume 37. As described in FIG. 5, the transparent optic 12 comprises the first turning optic 13. Light rays 39 from the scene 15 enter into the optical volume 37a and propagate towards the coupler 19. The coupler 19 will re-direct the light from the transparent optic 12 to the additional transparent optic 20. The additional transparent optic 20 may redirect the light towards the optic 38. The embodiment provides the advantage of compacting the overall form factor towards smaller area footprint when the trade-off is favorable. For example, in fields of proximate imaging in the context of machine vision and industrial automation, the size of the optical system may be restricted by the space available.

Figure 6:
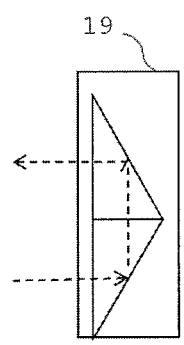
FIG. 6 illustrates an exemplary coupler according to one embodiment herein.

FIG. 6 illustrates an exemplary coupler according to one embodiment herein. In the shown example of FIG. 6, the coupler 19 comprises a pair of prism 21a and 21b that reverse the light after shifting in one direction.

Figure 7:
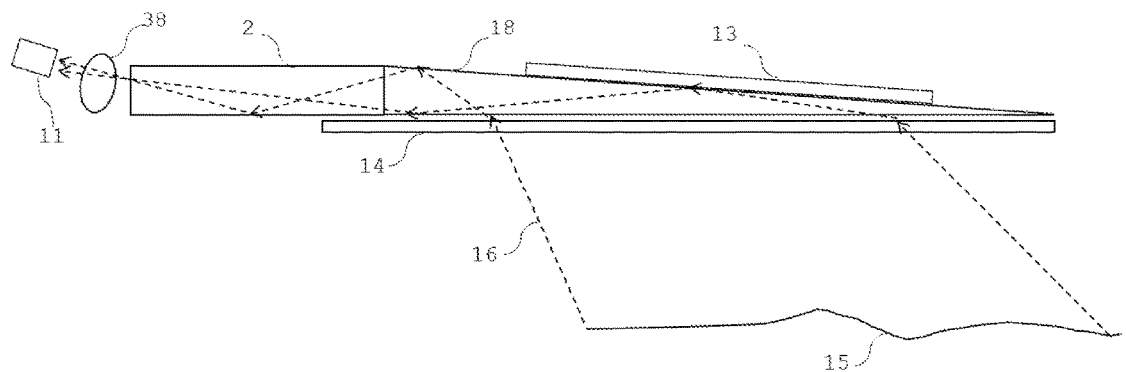
FIG. 7 illustrates a transparent optic according to an embodiment herein.
Figure 8:
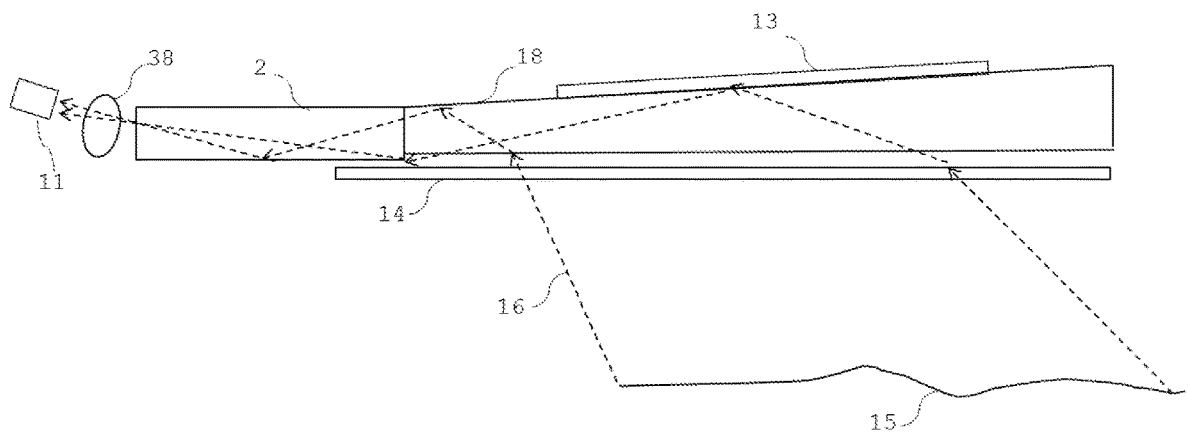
FIG. 8 illustrates a transparent optic according to an embodiment herein.

Referring now to FIG. 7, according to one embodiment, a portion 12a of the transparent optic 12 comprises a geometry of a wedge. The wedge geometry of the portion 12a is used for turning the light rays 39 in conjunction with the first turning optic 13. Since the first turning optic 13 is dedicated to turning the light rays 39 and reduce angle between the critical angle for exit, a higher flexibility is possible in the case of wedge designs. According to an embodiment, the wedge geometry of the portion 12*a* may taper in the opposite direction, as illustrated in FIG. 8.

Figure 9:
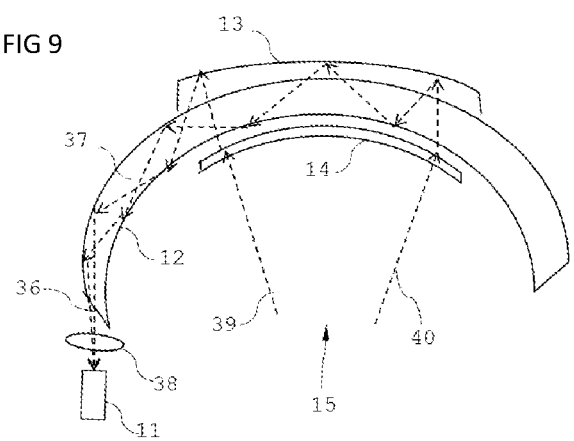
FIG. 9 illustrates a transparent optic comprising a curved geometry according an embodiment herein.

Referring now to FIG. 9, according to one embodiment, the transparent optic 12 may comprise a curved geometrical structure. As illustrated in FIG. 9, the light rays 39, 40 from the scene 15 reach the curved geometrical structure of the optical volume 37 and meet the first turning optic 13. As depicted in FIG. 9, the first turning optic 13 directs the light rays 39, 40 towards the side face 36 towards a coupling optic 38. The rays after exiting the optical volume 37 are conditioned to reach the photosensor assembly 11. In one embodiment, the first turning optic 13 is placed on the convex face of the optical volume 37 in order to accept light from the concave side. An opposite configuration is achievable by changing the location of the first turning optic 13 from the convex to the concave face. In this case, imaging can be performed on the convex surface. Such an optical system, where the transparent optical volume has a curved geometrical structure can be used to scan curved objects like bottle labels, hand biometrics on door handles etc.

Figure 10:
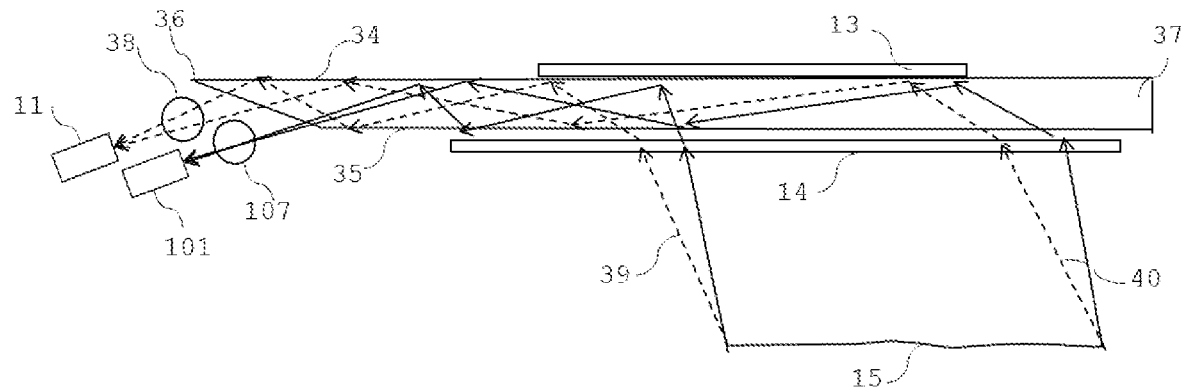
FIG. 10 illustrates an optical system for capturing light from different viewpoints according to an embodiment herein.

Referring now to FIG. 10, according to one embodiment, a plurality of image sensors may be used for capturing light from different viewpoints. As depicted in the example of FIG. 10, the optical system 10, comprises the photosensor assembly 11 and an additional photosensor assembly 101 for capturing light from different viewpoints of the scene 15. Different light rays, depicted as 39 and 40, from a particular point, reach the first turning optic 13 at different positions. The tertiary optics 38 and 107 are provided for directing light on the photosensor assembly 11 and the additional photosensor assembly 101 respectively for capturing the light rays 39, 40 from different viewpoints. Using two imaging sensors, i.e., the photosensor assembly 11 and the additional photosensor assembly 101 allow for 3D image capturing via stereo. Use of three or more image sensors may provide the advantage of capturing the light field. Such a device could also function as a goniometer.

Figure 11:
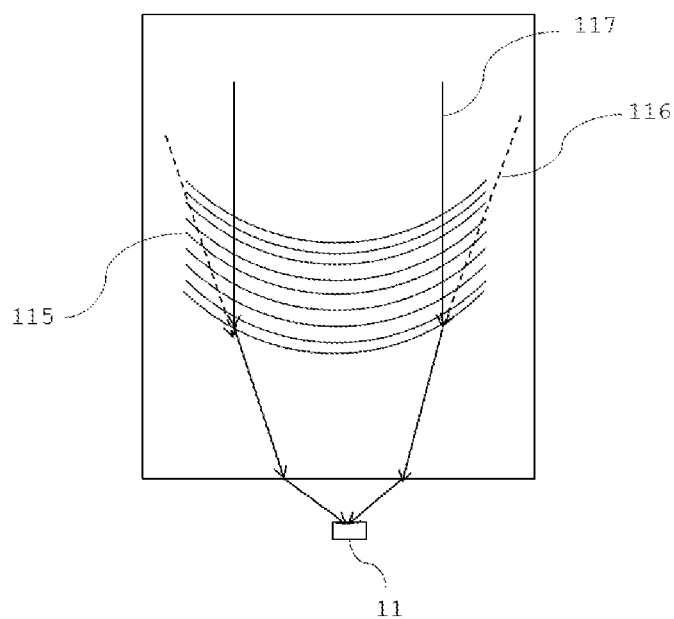
FIG. 11 illustrates an exemplary example of a first turning optic 13 according to an embodiment herein.

FIG. 11 illustrates an exemplary example of a first turning optic 13 according to an embodiment herein. As illustrated in the shown example of FIG. 11, a plurality of prismatic or trapezoid structures arranged adjacent to each other but curved in a lateral direction are illustrated as the geometrical structures 105 of the first turning optic 13. As illustrated in the example of FIG. 11, the curvature provides the advantage of capturing multiple views of the scene and the parameters such as aspect ratio, distortion, and the like, with increased accuracy. In the example of FIG. 11, the curved geometrical structures 105 turn the incident light ray 39 such that the light rays 39 are turned into a plurality of different planes.

Figure 12:
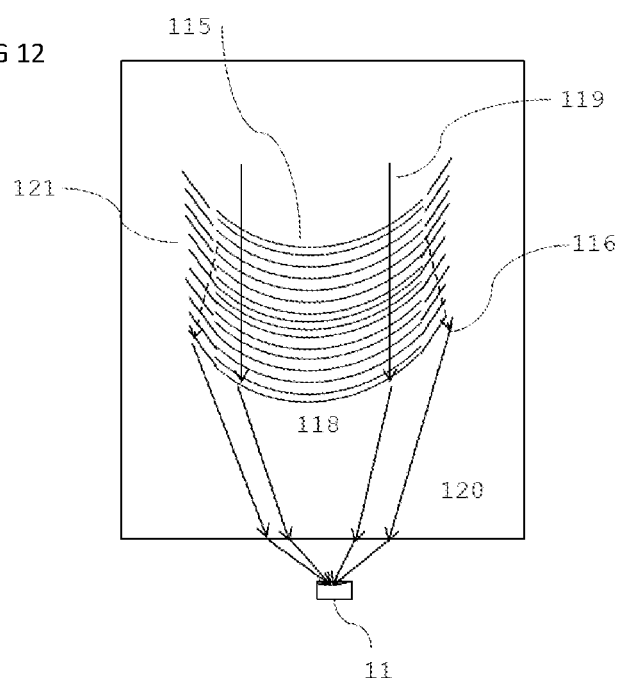
FIG. 12 illustrates a first turning optic according to an embodiment herein.

According to another embodiment, as depicted in FIG. 12, a plurality of prismatic or trapezoid structures arranged adjacent to each other but curved in the lateral direction are illustrated as the geometrical structures 105 of the first turning optic 13. According to one embodiment, the first turning optic 13 comprises one or more secondary turns 116. This provides the advantage of imaging targets from different directions surrounding the target. The data can then be read out to form a 3D surface image or panoramic image.

Figure 13:
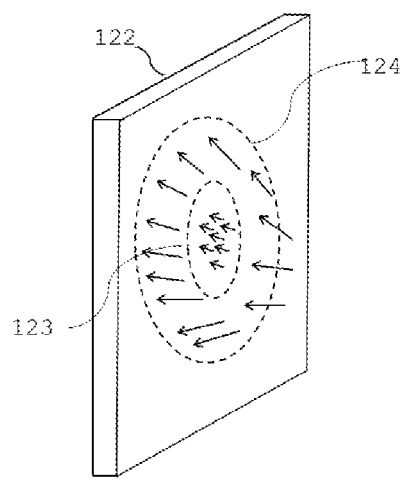
FIG. 13 illustrates an exemplary side view of a transparent optic, wherein the optical volume defines a plurality of zones due to the first turning optic according to an embodiment herein.

FIG. 13 illustrates an exemplary side view of a transparent optic 12, wherein the optical volume 37 defines a plurality of zones formed due to the first turning optic 13 of FIG. 11 and FIG. 12. As depicted, the optical volume 37 defines two zones 123 and 124 wherein rays 39 reach the target at a certain angle whereas rays 39' reach the target at different angles. This provides the benefit of imaging targets from different directions surrounding the target. The data can then be read out to form a 3D surface image or panoramic image.

Figure 14:
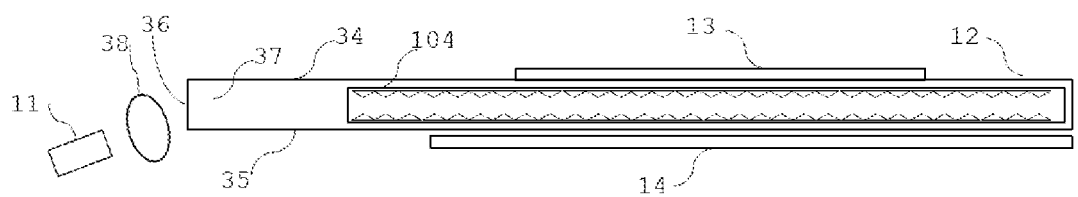
FIG. 14 illustrates a transparent optic according to an embodiment herein.

FIG. 14 illustrates a transparent optic according to an embodiment herein. As depicted in the example of FIG. 14, an optical volume 37 defined by the transparent optic 12 is hollow. The optical volume 37 being hollow comprises additional layers of optics. The additional layers of optics 104 may be arranged on any one of the internal surface of the transparent optic 12 or on both the internal surfaces. The optic 104 may be a turning optic.

Figure 15:
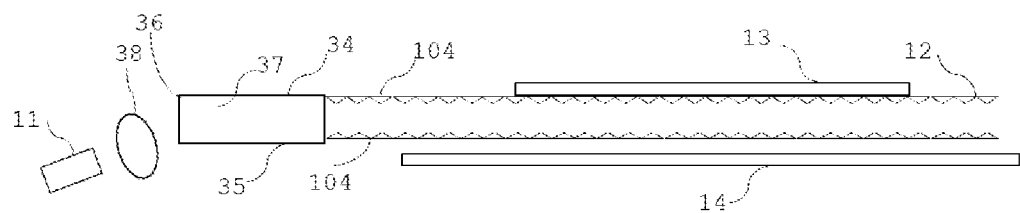
FIG. 15 illustrates a transparent optic wherein a series of optical sheets may be arranged into the hollow optical volume according to an embodiment herein.

FIG. 15 illustrates an embodiment wherein a series of optical sheets 104 may be arranged into the hollow optical volume 37. For example, structural members may be used to support the optical sheets 104 in position. Such an embodiment also allows for flexibility and stretch-ability. According to an embodiment, one or more sides of the internal surfaces may be coated with an antireflection coating.

Figure 16:
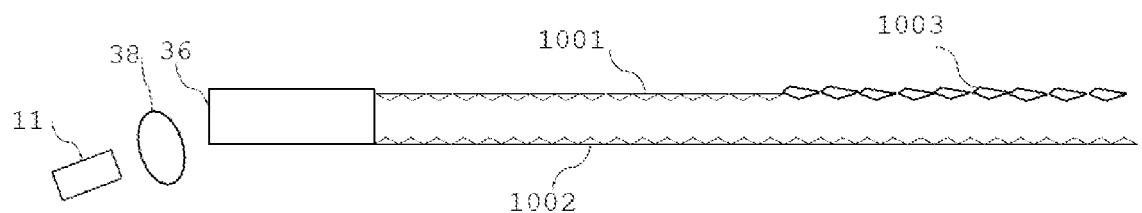
FIG. 16 illustrates a transparent optic according to an embodiment herein.

In another embodiment, as depicted in FIG. 16, the transparent optic 12 comprises three optical surfaces. Light enters the first optical surface 1002 and is redirected by the turning optic 1003 to be contained between the two surfaces 1002 and 1001 until it reaches a third face where it exits the transparent optic 12. In the shown example of FIG. 16, the light exiting the transparent optic 12 is incident onto a photosensor assembly 11. As seen in FIG. 16, a portion of one of the surfaces comprises a polygonal structure configured in such a manner that light reflecting between the two surfaces does not change the relative angle of reflection, whereas in another portion 1003, the angle is increased or decreased. The structures 1003 could be a quadrilateral in cross section.

Figure 17:
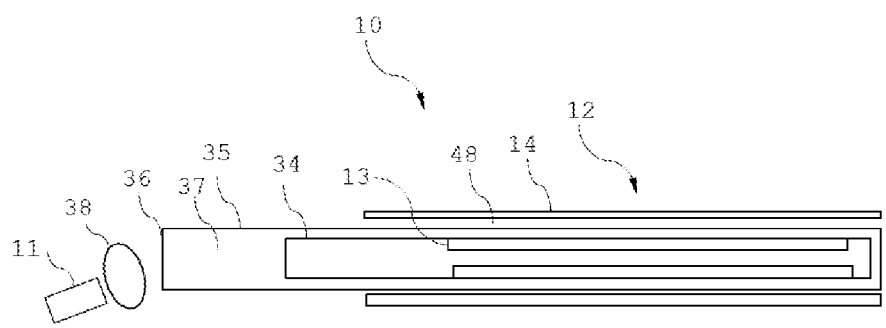
FIG. 17 illustrates an optical system according to another embodiment herein.
Figure 18:
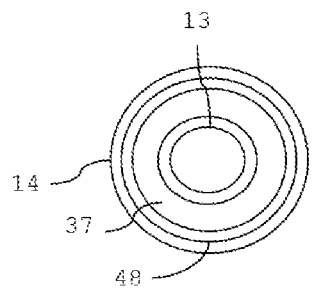
FIG. 18 illustrates a cross-sectional view of the transparent optic of FIG. 17 according to an embodiment herein.

FIG. 17 illustrates an optical system 10 according to another embodiment herein. In the shown example of FIG. 17, the transparent optic 12 defines an optical volume comprising a cylindrical structure. According to one embodiment, the optical volume 37 comprises a plurality of layers of optics on one of either of the internal surfaces. The first turning optic 13 is arranged on the second main face 34. The secondary turning optic 14 is coupled to the first main face 35 via a layer 48 having a refractive index lower than the refractive index of the optical volume 37. FIG. 18 illustrates a cross-sectional view of the transparent optic of FIG. 17, according to an embodiment. The example of FIG. 18 depicts the first turning optic 13, the optical volume 37 and the secondary turning optic 14 coupled to the transparent optic 12 via the layer 48.

Figure 19:
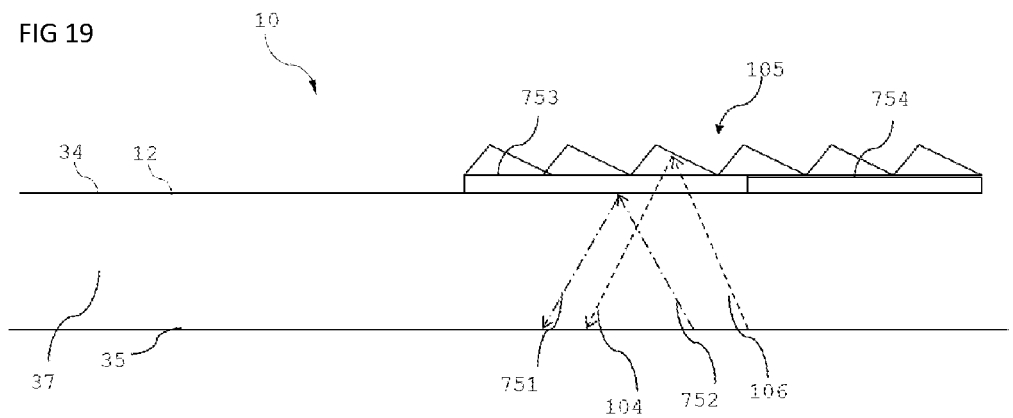
FIG. 19 illustrates an optical system according to an embodiment herein.

FIG. 19 illustrates an optical system 10 according to another embodiment herein. In the shown example of FIG. 19, the first turning optic 13 comprises an array of geometrical structures 105 placed adjacent to each other running along a portion of the transparent optic 12. FIG. 19 illustrates the first turning optic 13 which is coupled to the transparent optic 12 via a wavelength selective filter. In the shown example of FIG. 19, an optical filter 753, such as a Bragg grating, is illustrated as the wavelength selective filter. Light rays 106 incident on the optical filter 753 behave differently depending on the wavelength of light. Bragg gratings can be inscribed such that light rays of a certain wavelength reflect off the Bragg grating at a certain angle such as rays 752 reflected as 751 while rays of other wavelengths transmit through the Bragg grating and reflect off the prismatic structures such as rays 106 reflected as 104 at a different angle. Different Bragg gratings can be placed at different locations such as 753 and 754 sensitive to different wavelengths of light.

Figure 20:
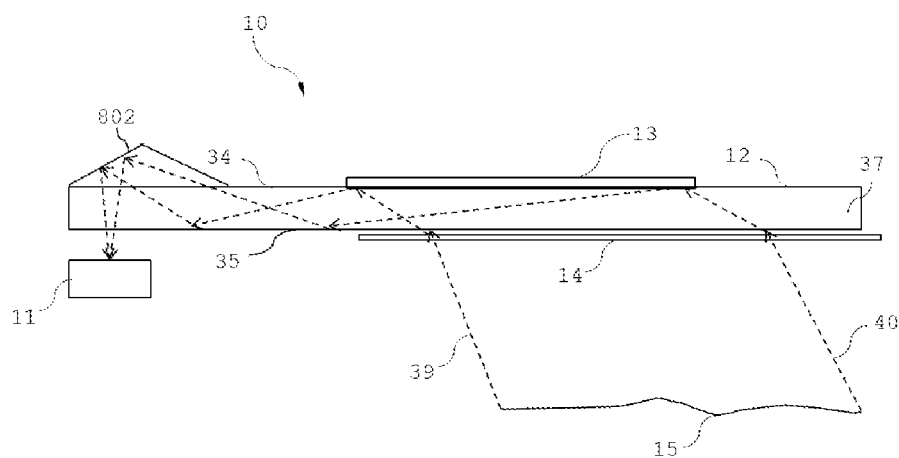
FIG. 20 illustrates an optical system according to an embodiment herein.

According to another embodiment, as depicted in FIG. 20, the light rays 39 and 40 from a target scene 15 enter the optical volume 37 via a secondary turning optic 14 and reaches the first turning optic 13 to be contained within the optical volume 37 until it reaches a redirecting optic 802 which reflects the light towards a photosensor assembly 11. The redirecting optic 802 conditions the light rays 39 and 40 in such a manner that they are emitted at appropriate angles towards the photosensor assembly 11. An advantage of such an embodiment is that the photosensor assembly 11, the redirecting optic 802, the first turning optic 13 and the secondary turning optic 14 can be applied to an existing transparent optic 12, such as a glass window or table and render it as an optical system for collecting light.

Figure 21:
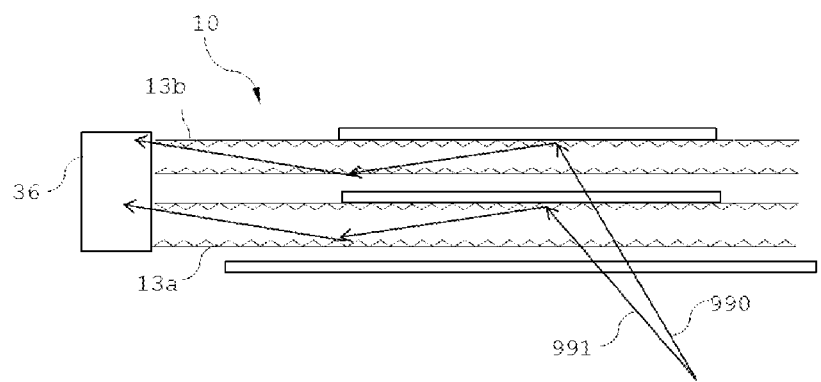
FIG. 21 illustrates an optical system according to an embodiment herein.

According to another embodiment, as depicted in FIG. 21, the optical system 10 comprises a plurality of transparent optics 12a, 12b arranged in a cascading manner. For example, the plurality of transparent optics 12a, 12b may be arranged one above another. As shown in FIG. 21, the transparent optics 12a, 12b are cascaded such that a certain range of angles of incident light 991 are captured by a first transparent optic 12a and transmitted to the exit face 36 while another range of angles of the incident light 990 are transmitted by the first transparent optic 12a into the second transparent optic 12b which then turns the light into the exit face 36. Several of such transparent optics 12a, 12b can be cascaded where each transparent optic has a certain first turning optic, common or dedicated.

Figure 22:
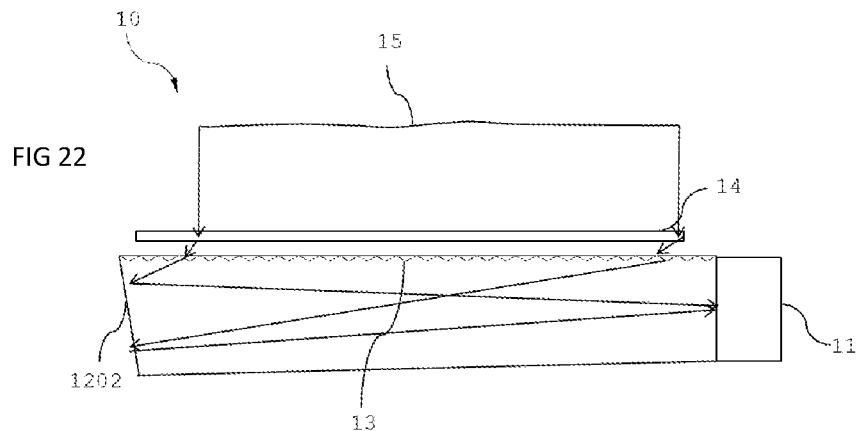
FIG. 22 illustrates an optical system according to an embodiment herein.

Referring now to FIG. 22, an optical system 10 is illustrated according to another embodiment herein. In the shown example of FIG. 22, light from a target scene 15 is incident on a secondary turning optic 14 and redirected to a first turning optic 13 such that it is subsequently incident on a reflecting face 1202. In certain embodiments, the reflecting face 1202 is curved laterally. The reflecting face 1202 reflects the light to a photosensor assembly 11.

Figure 23:
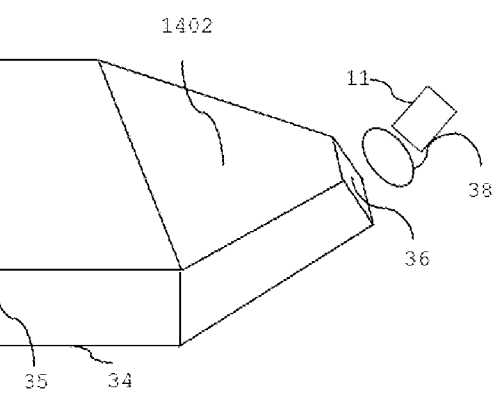
FIG. 23 illustrates an optical system according to an embodiment herein.
Figure 24:
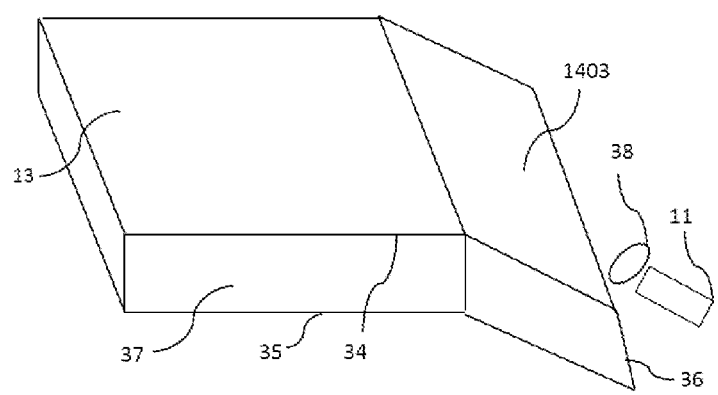
FIG. 24 illustrates an optical system according to an embodiment herein.
Figure 25:
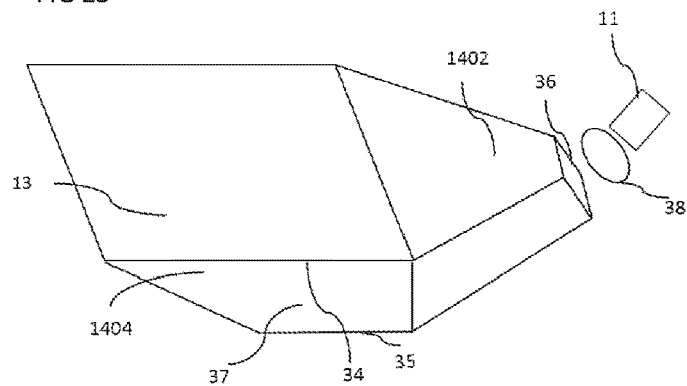
FIG. 25 illustrates an optical system according to an embodiment herein.
Figure 26:
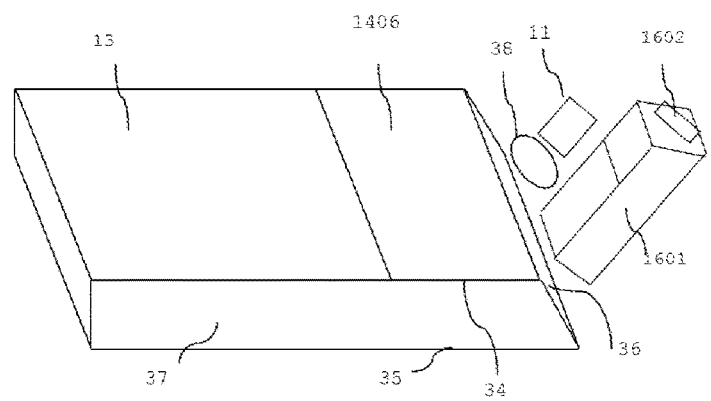
FIG. 26 illustrates an optical system according to an embodiment herein.

Referring now to FIG. 23, according to an embodiment herein, a propagation area 1402 of the transparent optic 12 is cut laterally to comprise a triangular geometrical profile. This provides the advantage of reduced material consumption and weight. The term propagation area used herein is defined as a portion of the transparent optic 12 where the light rays propagate through internal reflection without undergoing a turn from the first turning optic. In the propagation area 1402, the light rays propagate through internal reflection between the first main face 34 and the second main face 35. According to an embodiment, as depicted in FIG. 24, the propagation area 1402 can be tilted out of the plane of the optical volume 37. According to an embodiment, as depicted in FIG. 25, a portion 1404 of the transparent optic 12 comprising the first turning optic 13 may comprise a geometrical structure of a wedge. According to another embodiment, the propagation area 1402 may comprise a triangular profile, as illustrated in FIG. 24. The illumination of the target scene can be achieved using a similarly scaled optic located on the face 36 as depicted in FIG. 26. The illumination optic 1601 is placed in a manner to direct light from a source 1602 into the surface 36. This light exits the optical volume 37 via the first turning optic 13 onto the target. This illumination pattern is optimized such that the resultant illumination from a uniformly reflecting target is uniform at the photosensor assembly 11.

According to an embodiment, the illumination exiting out of the transparent optic 12 is a batwing profile.

The embodiments described herein provides the advantage of the optical system collecting light from a large area of the scene or source and condensing it to a smaller photosensor assembly. Also, reduction in the distance between the scene and the optical system is achieved. Conventional system, such as a lens does not provide the advantage of reduction in the distance. Also, the conventional systems have the disadvantage of being bulky. The optical system described in the embodiments herein provides a compact and substantially flat configuration. Moreover, the optical system may be developed using a flat transparent optic, wherein the two main faces of the transparent optic are parallel. The first turning optic can be arranged on one of the main faces of the transparent optic. This provides the advantage of easy manufacturing of the optical system.

The optical system described in the embodiments herein can be used in a 2D camera and for measuring light distribution. For example, the photosensor assembly can be an image sensor or an array of photodiodes, the secondary optic transfers the incoming light from an angular distribution to a spatial distribution on to individual pixels. The pixels are then readout to obtain the image of the scene. For example, such a system could be used in X-ray imaging, diagnostics and point of care, dental imaging, biometric imaging, imaging a meter or gauge, document scanner, borescopic imaging, and luminaires. For example, for X-ray imaging, as CMOS sensor resolutions increase, it is desirable to use a fluoroscopic chain consisting of a scintillator that fluoresces followed by a camera to image the fluorescence. Using conventional cameras creates a bulky design. The optical system described in the embodiments herein allows for a compact fluoroscopic chain. In aspects of diagnostics and point of care systems, semi-automated or fully automated systems capture light from material samples. Several samples are placed in front of the optical device. Each sample either reflects or emits light at certain wavelengths. A plurality of Photosensor assemblies can be used, each with an optical filter separating desired wavelengths. Each photosensor assembly can identify the light from a particular sample. Combining the measurements of the plurality of photosensor assemblies, each sample spectrum can be analyzed and later used to identify pathology or condition. Such a design increases through-put as well as decreases mechanical complexity of the device.

Figure 27:
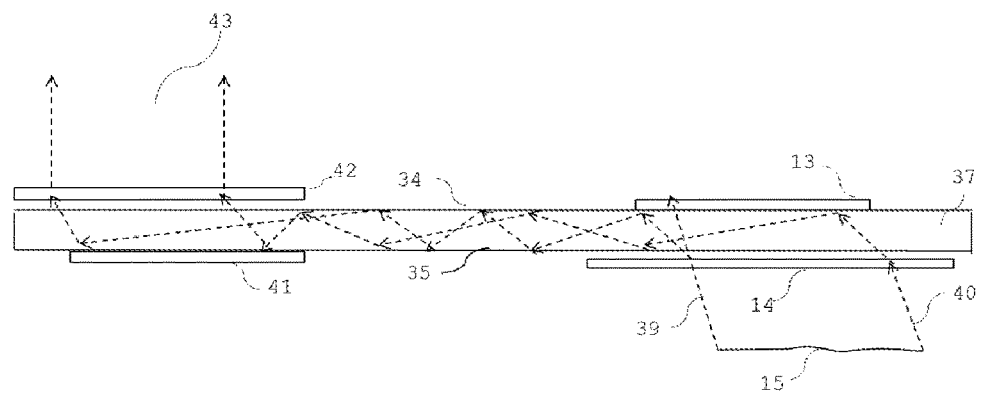
FIG. 27 illustrates an application of an optical system in dental imaging according to an embodiment herein.
Figure 28:
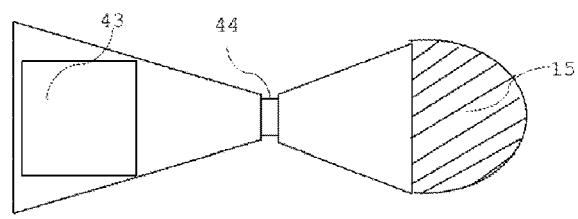
FIG. 28 illustrates a dental imaging device comprising an optical system according to an embodiment herein.

In aspects of dental imaging, in a dental application, as depicted in FIG. 27, instead of transferring light to a sensor, the light could be delivered to another possibly large area 43 to accommodate another optical device or even the eye. As, illustrated in FIG. 28, an optical coupler 44 could be used to rotate one end of the device in order to rotate the field of view or in this case, obtain different views of upper and lower teeth. Here, the area of delivery would consist of a third turning optic 42 of FIG. 27 and a fourth turning optic 41 of FIG. 27.

In aspects of a biometric reader, the optical system can be used to read and verify a hand geometry, fingerprint, face and iris image. The concept could be used to construct a single device performing one or more of the aforementioned biometric image capture and verification. A key pad can be printed or projected on one of the faces of the optical device and using the concept of frustrated total internal reflection, the location of a key press can be detected. Thus, user interaction can be captured in this manner.

Figure 29:
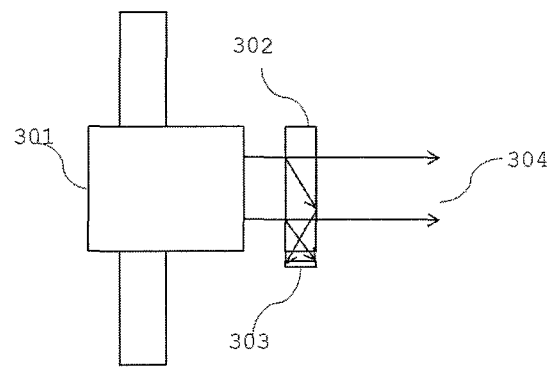
FIG. 29 illustrates an application of an optical system in gage imaging according to an embodiment herein.

In aspects of imaging a meter or gauge, as depicted in FIG. 29, the optical system 10 is placed in front of the gage 301 to be read out (in remote monitoring or continuous monitoring scenarios) via image capturing. However, placing a camera will restrict the viewing of the gauge by a human. This may be avoided by using a transparent optic that redirects some of the light towards a camera 303 placed off-axis of the gage allowing for image capture as well as allowing a user 304 to view the gauge.

Figure 30:
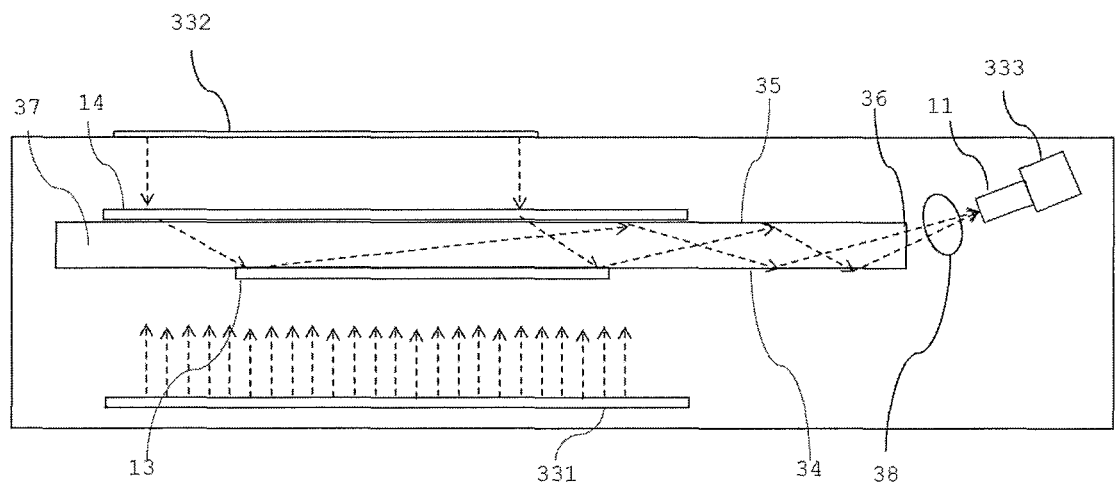
FIG. 30 illustrates an application of an optical system in a flatbed scanning device according to an embodiment.

In aspects of a document Scanner, FIG. 30 illustrates a flatbed scanner device comprising the optical system described by the embodiments herein. The flatbed scanner device comprises a light source 331 that illuminates an object 332. For example, the object 332 may be a sheet of paper. The reflected light enters the optical volume 37 and gets turned by the first turning optic 13 to reach the photosensor assembly 11 as explained in earlier embodiments. Motion stages 333 allow for movement of the photosensor assembly 11 enabling increase in field of view or obtain several images and reconstruct a high resolution image. The motion stage could be a motor or piezoelectric device. A configuration such as this allow for higher speed of scanning and increased throughput for automated scanning devices.

In aspects of borescopic imaging, the optical system can be used for borescopic imaging allowing for quicker image capture and simpler motion staging than existing borescopic systems.

In aspects of luminaires, since the transparent optic can be made using thin and flexible material, it can be applied to a large surface as a ubiquitous camera. For example, a thin optic that runs all along the ceiling of a room could provide image data that could be used for occupancy sensing.

The optical system can also be used in a 3D camera. Two or more image sensors can be placed adjacent to the photosensor assembly in order to obtain images from multiple views. The views are combined as stereo component images and a 3D image is obtained of the scene. Another embodiment is a photosensor capable of capturing spatial distribution as well as time of flight information. The sensor can obtain the time of arrival of light rays, which then coupled to the optical system allows for obtaining time of flight information of light from each point in the scene. This time of flight information could be used to create a depth map. Another embodiment is the collection of structured light reflected off a surface, which can also be used to capture 3D structure of the target.

Figure 31:
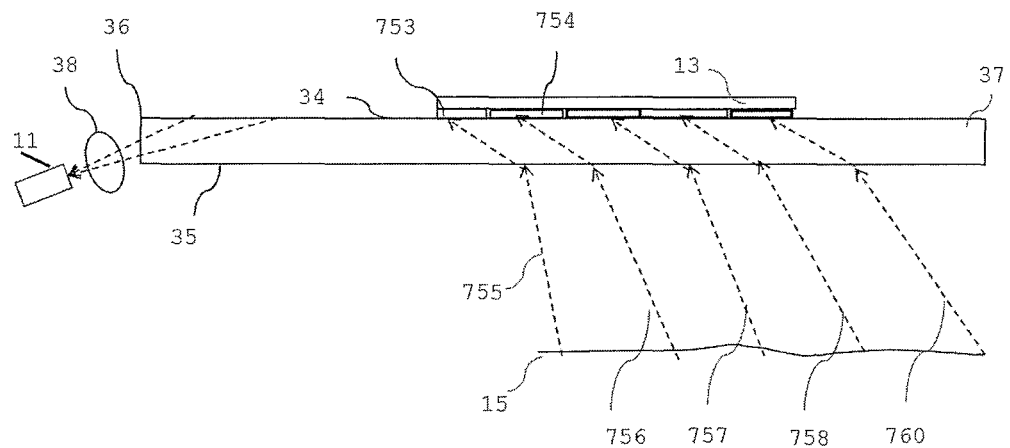
FIG. 31 illustrates an application of an optical system in a spectrometer according to an embodiment herein.
Figure 32:
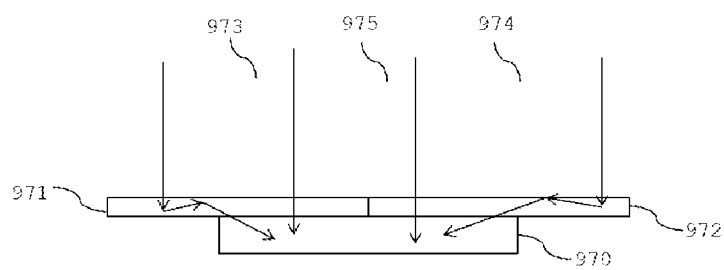
FIG. 32 illustrates an application of an optical system in a light collecting system of a solar panel according to an embodiment herein.
Figure 33:
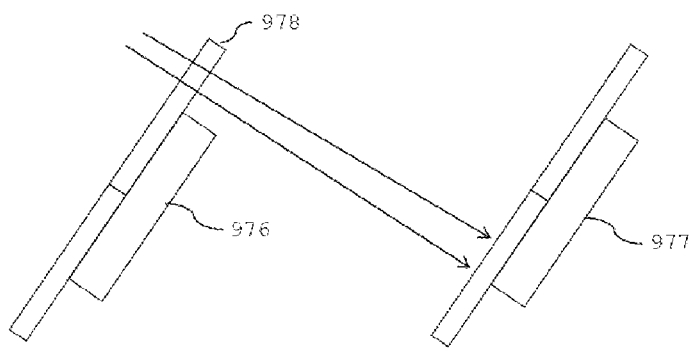
FIG. 33 illustrates an application of an optical system in a light collecting system of a solar panel according to another embodiment herein.

Additionally, the optical system can be used for light field imaging. Different groups of pixels could be used to reconstruct the light field data of the target. The optical system may also be used in a spectrometer. Apart from a lens, a grating could be placed in between the photosensor assembly and the optical volume wherein spectral data could be deciphered from the measurements. As depicted in FIG. 31, the optical system 10 is appended with several Bragg gratings 753, 754 of different wavelength transmission and reflection values. Light from the target containing different spectra are fed at the input surface of the optical system 10 and are seen to be reflected at different locations depending on the wavelength. In this manner, light sources can be combined. The optical system 10 may also be used as a light concentration device. The optical system 10 may be used to concentrate light onto photovoltaic cells and collect energy. As depicted in FIG. 32, the optical system 10 is appended to a light collecting system such as a solar panel to increase the effective area of light collection. The optical systems 10*a* and 10*b* are placed near the solar panel 970. Light from the sun directly reaches the solar panel 970 as shown as rays 975 whereas the rays 973 and 974 reach the optical device and are fed into the solar panel, thereby increasing throughput. Referring now to FIG. 33, the optical system 10*a* and 10*b* can also be configured such that rays from the sun reaching the optical system 10*a* of the solar collection system 976 pass through the optical system 10*b* and reach the solar panel of another device 977 in order to maximize power production. This is accomplished by varying the turning film parameters mechanically.

Figure 34:
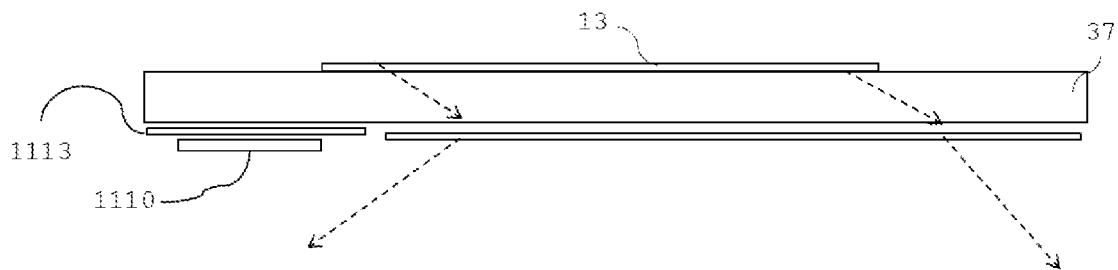
FIG. 34 illustrates an application of an optical system in user authentication system according to an embodiment herein.

According to an embodiment, the optical system may also be used in wearable gadgets, for example a wearable glass. As the configuration of the optical system is flexible, it may be used in wearable gadgets for human. An additional function is that the device could view the iris or retina and capture images for authentication. The optical system may also be used as a user authentication card for authentication purpose. As depicted in FIG. 34, the optical system 10 is configured as a slim identification card such that a reader could direct light into the primary optic for illuminating a region where a finger print can be placed. The light from the finger is reflected and travels back to the reader 1110 wherein the finger print image is read. User authentication proceeds via an additional read of a magnetic or an RF card. A card swipe action whilst placing the finger on the reader would allow a simultaneous dual authentication in one swift action.

Figure 35:
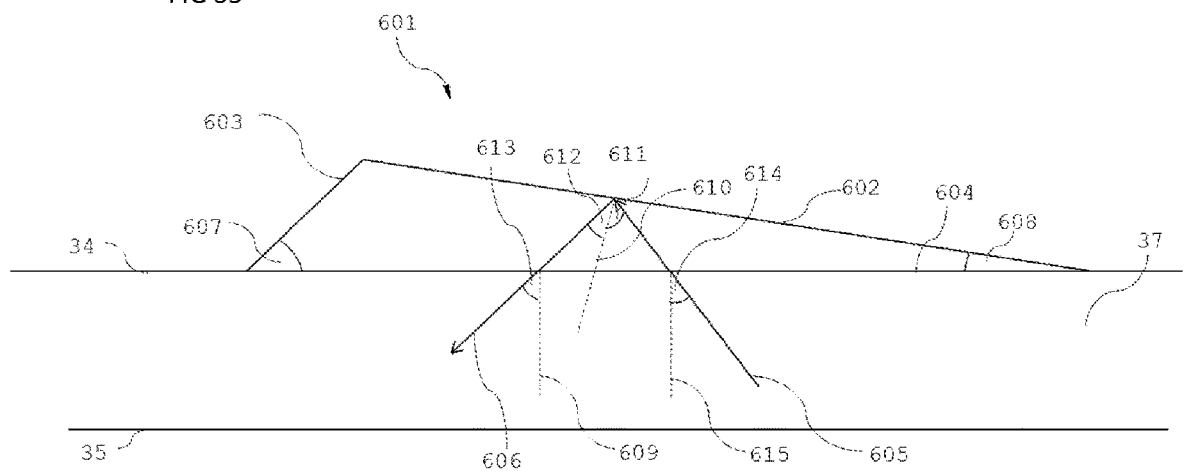
FIG. 35 illustrates the geometrical structure of the prism of the first turning optic according to an embodiment herein.

One embodiment of the geometric structure is depicted as 601 in FIG. 35. The structure is a prism bounded by the base face 604, the leading edge face 602 and the trailing edge face 603. Alternatively, the face 604 could be a portion of the second main face 34. A ray 605 arising from the transparent optic volume 37 passes through the face 604 and is reflected by the face 602 to return as the ray 606. The reflection by the face 602 imparts a turn in the rays. In essence, if the ray were to reflect off faces 34 or 35, such a turn would not be imparted.

Still referring to FIG. 35, the angle of incidence 611 of the ray 605 and the angle of reflection 612 are the same as measured from the surface normal 610. However, when measured from the surface normal 615 of the face 34, the angle 614 is different from the angle 613 subtended by the reflected ray 606 at the surface normal 609. This change in angle is facilitated by the geometric structure to condition the ray 605 to exit the optical volume 37 in a prescribed manner.

The angle 608 of the leading edge face is small in-order to impart a small turn in direction of the ray 605. In a certain embodiment, the angle 608 is less than 10 degrees. In another embodiment, the angle is less than 3 degrees. In yet another embodiment, the angle is less than 1 degree.

In the embodiment where the angle 608 is comparatively lesser, the ray 605 would require a larger number of reflections to be conditioned to exit the optical volume 37. In effect, the distance between the faces 34 and 35 can be reduced to enable a slimmer optical device for scanning.

The second angle of the prism 607 is less than a prescribed value. This avoids the collision of rays 606 and the face 603, thereby preventing loss of rays or spatial structure. Since the rays may undergo multiple interactions between the prismatic structures wherein each interaction results in an additional turn, the second angle 607 is chosen to prevent collision of the reflected ray and the prismatic face 603 at the respective prism. Critical angle is defined as the angle of incidence above which total internal reflection occurs. In an embodiment, the second angle of the prism 607 is less than the difference of 90 degrees and critical. In a further embodiment, the second angle of the prism 607 is less than the difference 90 degrees and the sum of the critical angle and product of the number of reflections undergone by the ray 605 and twice the prism angle 608.

Figure 36:
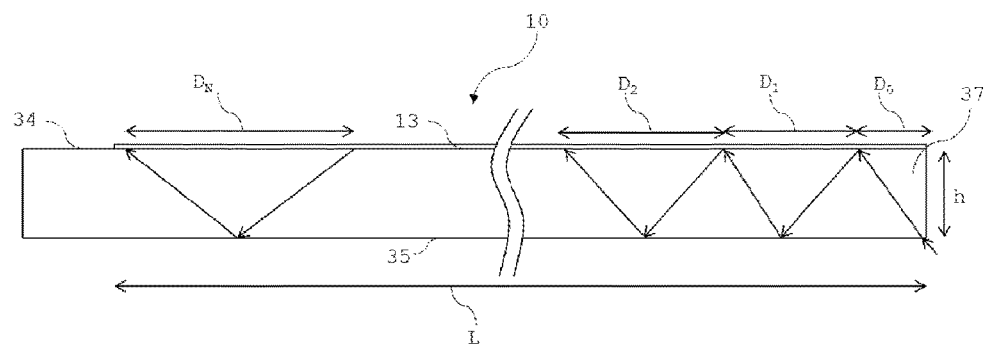
FIG. 36 illustrates an optical system according to an embodiment herein.

FIG. 36 illustrates the path of a ray entering from one extreme of the face 34. Once the ray enters, it undergoes one or more reflections within the optical volume 37. In the event of multiple reflections, the angle successively is altered and the distance between the point of reflection increases. The distance between the point of entry and the first reflection is $D_0$, whereas the distance between the first and the second reflection is $D_1$ and so on. These distances are given by the following formulae.

$$D_0 = h \tan(t_c)$$

$$D_1 = 2h \tan(t_c + r)$$

$$D_N = 2h \tan(t_c + Nr)$$

Where r is the angle of turn imparted at each reflection and N is the total number of reflections undergone by the ray under the influence of the turning optic.

The length of the area adapted to admit light L is the sum of the distances $D_0 + D_1 + \ldots + D_N$.

Figure 37:
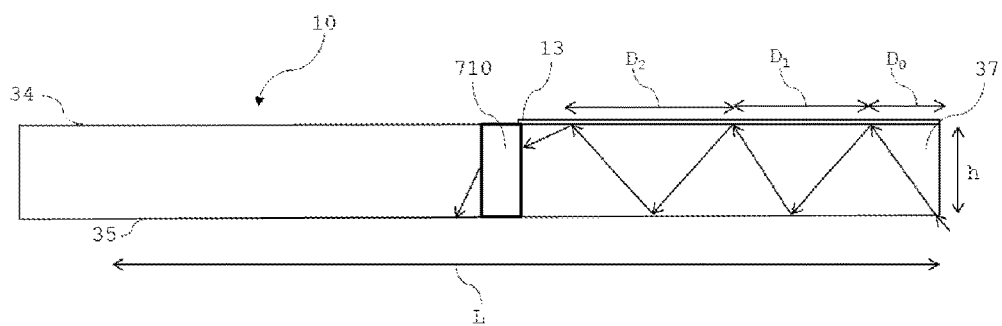
FIG. 37 illustrates an optical system according to an embodiment herein.

As illustrated in FIG. 37, the propagation area length can be reduced by imparting a further turn by 710 to the rays exiting the area adapted to receive light. Increased reflections in the propagation area allow for a decreased propagation area length. In an embodiment, the opposing faces of the propagation areas could be silvered, thus preventing the light exiting the optical volume even beyond the critical angle. The opposite faces of the propagation area may be coated with bragg gratings, photonic crystals or perfect mirrors to increase the efficiency of reflection.

FIG. 38 illustrates imaging of a scene or an object from multiple angles using a monolithic piece of optic and a single light sensor, lens or camera. Light from the same or different scene coming from a different direction falls on the offshoot area 705 and enters the optic's propagation area via a turning optic 700 which redirects light in a desired manner to reach the main optical volume. This turning optic 700 may be of the geometry of the first turning optic 13. Thus, light from two different directions, enters the optical volume and combines in the main optical volume to get transported to the photosensor assembly. This configuration may be used to capture side views along with the front view of objects like food items for quality control.

While this invention has been described in detail with reference to certain preferred embodiments, it should be appreciated that the present invention is not limited to those precise embodiments. Rather, in view of the present disclosure which describes the current best mode for practicing the invention, many modifications and variations would present them-selves, to those of skilled in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

I claim:

1. An optical system, comprising:
    a transparent optic comprising:
        a first main face;
        a second main face opposite to the first main face, wherein an optical volume is defined between the first main face and the second main face; and
    a first turning optic arranged on the second main face, for turning a light admitted inside the optical volume and passing through the second main face, such that the light is internally reflected within the optical volume, wherein the first turning optic provides an added turn angle, for the admitted light passing through the second main face,
    wherein the first main face is a single continuous surface throughout the transparent optic and the second main face is a single continuous surface throughout the transparent optic,
    wherein the first turning optic includes an array of geometrical structures arranged on the second main face and external to the optical volume, such that, at each interaction with the second main face, the light passing through the second main face enters into at least one of the array of geometrical structures and is reflected by at least one face of the geometrical structure, such that the first turning optic imparts a cumulatively larger turn angle at every interaction of the light with the first turning optic.

2. The optical system according to claim 1, wherein the first turning optic is arranged on a portion of the second main face.

3. The optical system according to claim 1, wherein the transparent optic further comprises one or more side faces for directing the light outside the optical volume.

4. The optical system according to claim 1, wherein the first turning optic is turns the light to a direction different from the geometric normal of the first main face.

5. The optical system according to claim 1, wherein the first turning optic turns the light to a direction different from the geometric normal of the second main face.

6. The optical system according to claim 1, wherein the geometrical structures selectively alter the direction of reflection.

7. The optical system according to claim 1, wherein the array of geometrical structures are prism or trapezoidal in shape.

8. The optical system according to claim 1, wherein the first turning optic simultaneously directs portions of the incident light in more than one direction.

9. The optical system according to claim 1, wherein the first turning optic is curved in one or more directions.

10. The optical system according claim 1, wherein the first turning optic is a layer formed on a portion of one of the first main face and the second main face.

11. The optical system according to claim 1, further comprising:
    an additional transparent optic defining an additional optical volume; and
    a coupler to receive the light emerging from the optical volume of the transparent optic after internal reflection and direct the light onto the additional transparent optic;
    wherein the additional transparent optic admits the light directed by the coupler.

12. The optical system according to claim 1, wherein a wavelength selective filter is placed between the first turning optic and the optical volume.

13. The optical system according to claim 1, further comprising a coupling device to direct light onto a portion of the first main face or the second main face.

14. The optical system according to claim 1, wherein a first portion of the incident light is admitted inside the optical volume and a second portion of the incident light is transmitted.

15. The optical system according to claim 1, wherein the geometrical structures reflect a first portion of the incident light and transmit a second portion of the incident light.

16. The optical system according claim 1, wherein the transparent optic comprises a propagation area comprising a triangular geometrical profile, wherein the light propagates through internal reflections between the first main face and the second main face in the propagation area.

17. The optical system according to claim 7, wherein each of the array of geometrical structures includes:
a base face, a leading edge face and a trailing edge face;
a first angle of each of the array of geometrical structures is defined as the angle between the leading edge face and the base face; and
a second angle of each of the array of geometrical structures is defined as the angle between the trailing edge face and the base face;
wherein, the value of the first angle is less than half the value of a critical angle and the value of second angle is at least one of less than (90-critical angle) and less than (90-critical angle−2*the first angle*number of reflections).

18. An optical system, comprising:
a transparent optic comprising:
a first main face;
a second main face opposite to the first main face, wherein an optical volume is defined between the first main face and the second main face; and
a first turning optic arranged on the second main face, for turning a light admitted inside the optical volume and passing through the second main face, such that the light is internally reflected within the optical volume, wherein the first turning optic provides an added turn angle, for the admitted light passing through the second main face,
wherein the first main face is a single continuous surface throughout the transparent optic without an opening therethrough and the second main face is a single continuous surface throughout the transparent optic without an opening therethrough,
wherein the first main face is parallel to the second main face, and
wherein the first turning optic includes an array of geometrical structures arranged on the second main face and external to the optical volume such that at each interaction with the second main face, the light passing through the second main face enters into at least one of the array of geometrical structures and is reflected by at least one face of the geometrical structure, such that the first turning optic imparts a cumulatively larger turn angle at every interaction of the light with the first turning optic.

19. An optical system, comprising:
a transparent optic comprising:
a first main face;
a second main face opposite to the first main face, wherein an optical volume is defined between the first main face and the second main face; and
a first turning optic arranged on the second main face, for turning a light admitted inside the optical volume and passing through the second main face, such that the light is internally reflected within the optical volume, wherein the first turning optic provides an added turn angle, for the admitted light passing through the second main face,
wherein the first main face is a single continuous surface throughout the transparent optic without an opening therethrough and the second main face is a single continuous surface throughout the transparent optic without an opening therethrough,
wherein the first main face is parallel to the second main face,
wherein the first turning optic includes an array of trapezoidal shaped structures arranged on the second main face and external to the optical volume such that at each interaction with the second main face, such that the first turning optic imparts a cumulatively larger turn angle at every interaction of the light with the first turning optic, wherein the light passing through the second main face enters into at least one of the array of trapezoidal shaped structures and is reflected by at least one face of the trapezoidal shaped structure,
wherein each of the array of trapezoidal shaped structures include:
a base face, a leading edge face and a trailing edge face;
a first angle of each of the array of trapezoidal shaped structures is defined as the angle between the leading edge face and the base face; and
the second angle of each of the array of trapezoidal shaped structures is defined as the angle between the trailing edge face and the base face;
wherein, the value of the first angle is less than half the value of a critical angle and the value of the second angle is at least one of less than (90-critical angle) and less than (90-critical angle−2* the first angle*number of reflections).

* * * * *